United States Patent
Park

(10) Patent No.: US 9,704,587 B1
(45) Date of Patent: Jul. 11, 2017

(54) SEMICONDUCTOR MEMORY DEVICE AND OPERATING METHOD THEREOF

(71) Applicant: SK hynix Inc., Icheon-si, Gyeonggi-do (KR)

(72) Inventor: Eun Young Park, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/173,874

(22) Filed: Jun. 6, 2016

(30) Foreign Application Priority Data

Jan. 8, 2016 (KR) .................. 10-2016-0002691

(51) Int. Cl.
  *G11C 16/04* (2006.01)
  *G11C 16/24* (2006.01)
  *G11C 16/08* (2006.01)

(52) U.S. Cl.
  CPC .......... *G11C 16/24* (2013.01); *G11C 16/0483* (2013.01); *G11C 16/08* (2013.01)

(58) Field of Classification Search
  USPC .......................... 365/185.17, 185.25, 185.18
  See application file for complete search history.

(56) References Cited

U.S. PATENT DOCUMENTS

2016/0189786 A1* 6/2016 Sakai .................. G11C 11/5671
    365/185.03
2016/0217866 A1* 7/2016 Lee ........................ G11C 16/30

FOREIGN PATENT DOCUMENTS

KR          101001449 B1    12/2010
KR          101036720 B1     5/2011
KR       1020140101625 A     8/2014

* cited by examiner

*Primary Examiner* — Vu Le
(74) *Attorney, Agent, or Firm* — William Park & Associates LTD.

(57) ABSTRACT

Provided herein are a semiconductor memory device and an operating method thereof. The semiconductor memory device may include: drain select transistor coupled to a bit line; a source select transistor coupled to a source line; a plurality of memory cells coupled in series between the drain select transistor and the source select transistor; and a peripheral circuit configured to successively apply a discharge control voltage to memory cells in sequence from a memory cell adjacent to the source select transistor to a memory cell adjacent to the drain select transistor.

19 Claims, 8 Drawing Sheets

FIG. 3

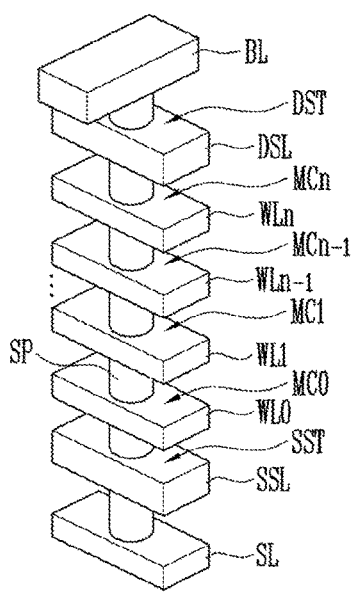

FIG. 4

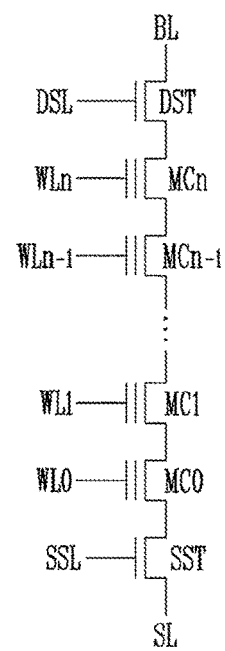

FIG. 5

```
         START
           │
           ▼
┌──────────────────────┐
│  INPUT READ COMMAND  │──S110
└──────────────────────┘
           │
           ▼
┌──────────────────────────────────────┐
│ SUCCESSIVELY APPLY DISCHARGE CONTROL │──S120
│ VOLTAGE IN SEQUENCE FROM WL0 TO WLn  │
└──────────────────────────────────────┘
           │
           ▼
┌──────────────────────┐
│ PERFORM READ OPERATION│──S130
└──────────────────────┘
           │
           ▼
          END
```

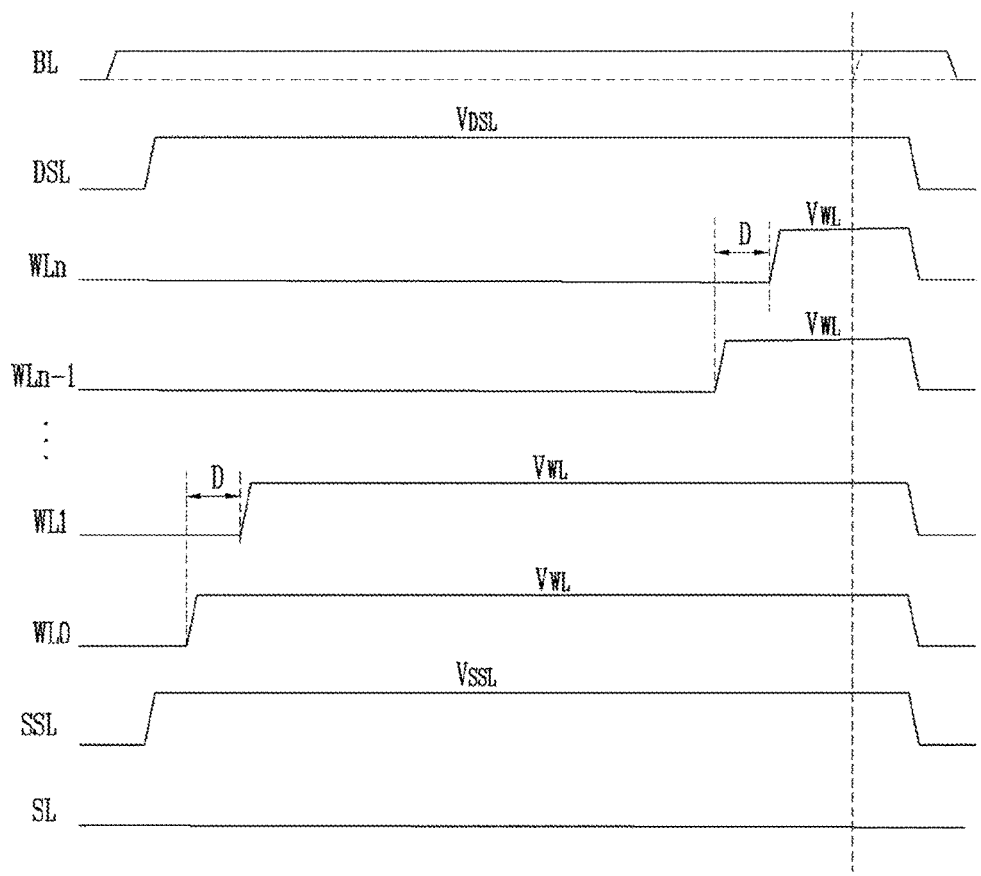

SEMICONDUCTOR MEMORY DEVICE AND OPERATING METHOD THEREOF

CROSS-REFERENCE TO RELATED APPLICATION

The present application claims priority under 35 U.S.C. §119(a) to Korean patent application number 10-2016-0002691, filed on Jan. 8, 2016, the entire disclosure of which is incorporated herein in its entirety by reference.

BACKGROUND

1. Technical Field

Various embodiments of the present disclosure relate to an electronic device, and more particularly, to a semiconductor memory device and an operating method thereof.

2. Related Art

Semiconductor memory devices are memory devices embodied using a semiconductor constructed using silicon (Si), germanium (Ge), gallium arsenide (GaAs), indium phosphide (InP), or the like. Semiconductor memory devices are classified into volatile memory devices and nonvolatile memory devices.

The volatile memory device is a memory device which loses data stored therein when power is cut off. Representative examples of volatile memory devices include a static RAM (SRAM), a dynamic RAM (DRAM), a synchronous DRAM (SDRAM), etc. The nonvolatile memory device is a memory device which retains data stored therein even when power is cut off. Representative examples nonvolatile memory devices include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memory may be classified into NOR type and NAND type.

SUMMARY

Various embodiments of the present disclosure are directed to a semiconductor memory device capable of improving the reliability of a sensing operation, and an operating method thereof.

One embodiment of the present disclosure provides a semiconductor memory device including: a drain select transistor coupled to a bit line; a source select transistor coupled to a source line; a plurality of memory cells coupled in series between the drain select transistor and the source select transistor; and a peripheral circuit configured to successively apply a discharge control voltage to the memory cells in sequence from a memory cell adjacent to the source select transistor to a memory cell adjacent to the drain select transistor.

Another embodiment of the present disclosure provides a semiconductor memory device including: a memory cell array including a plurality of memory strings; a peripheral circuit configured to apply operating voltages to the memory cell array; and a control logic configured to control the peripheral circuit such that a discharge control voltage is successively applied to a plurality of word lines coupled to the plurality of memory strings.

Another embodiment of the present disclosure provides a method for operating a semiconductor memory device, including: providing a plurality of memory cells coupled in series between a bit line and a source line; applying a positive voltage to the bit line and applying a ground voltage to the source line; and applying the discharge control voltage to the memory cells in sequence from a memory cell adjacent to the source line to a memory cell adjacent to the bit line.

BRIEF DESCRIPTION OF THE DRAWINGS

FIG. 3 is a three-dimensional view illustrating a memory string included in a memory block according to an embodiment of the present disclosure;

FIG. 4 is a circuit diagram illustrating the memory string shown in FIG. 3;

FIG. 5 is a flowchart illustrating an operation of a semiconductor memory device according to an embodiment of the present disclosure;

FIG. 6 is a timing diagram showing operating voltages to describe operation of the semiconductor memory device according to an embodiment of the present disclosure;

DETAILED DESCRIPTION

Advantages and features of the present disclosure, and methods for achieving the same will be illustrated with reference to example embodiments described later in detail together with the accompanying drawings. Accordingly, the present disclosure is not limited to the following embodiments but may be embodied in other types. Rather, these embodiments are provided so that the present disclosure will be thorough and complete, and will fully convey the technical spirit of the disclosure to those skilled in the art.

It will be understood that when an element is referred to as being "coupled" to another element, it may be directly coupled to the other element or intervening elements may be present therebetween. In the specification, when an element is referred to as "comprising" or "including" a component, it does not preclude another component but may further include other components unless the context clearly indicates otherwise.

Figure 1:
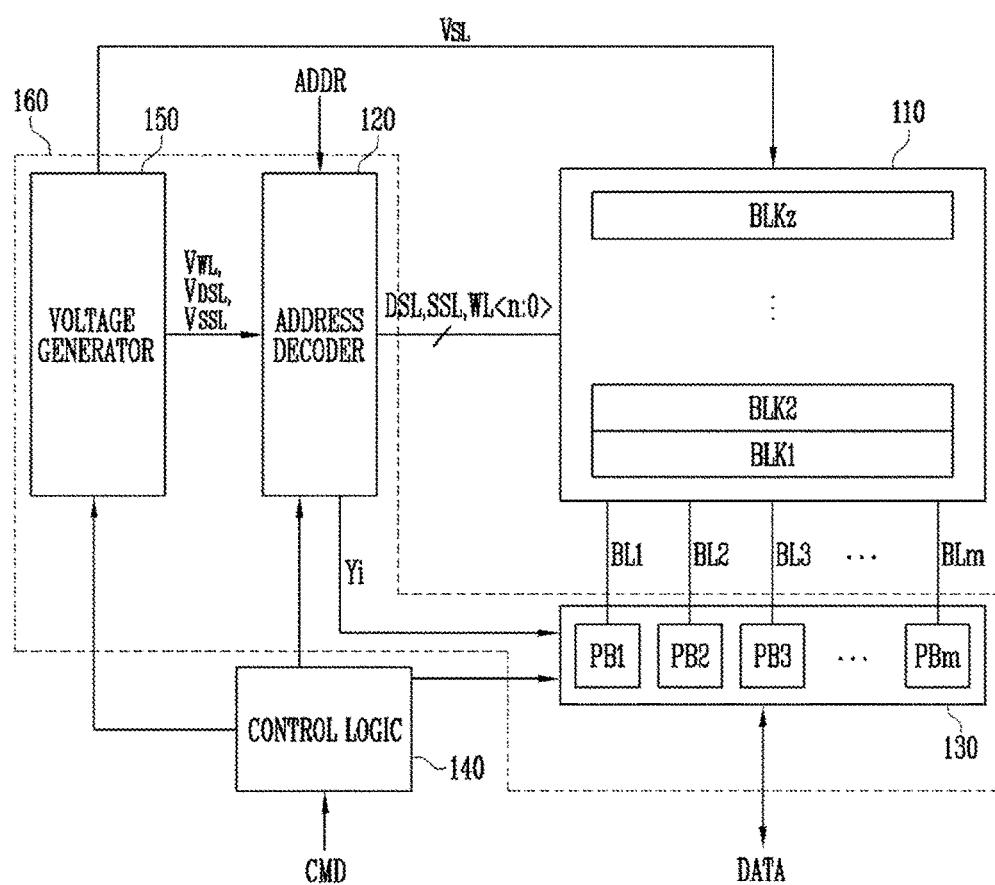
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 100 includes a memory cell array 110, an address decoder 120, a read/write circuit 130, a control logic 140, and a voltage generator 150.

The memory cell array 110 includes a plurality of memory blocks BLK1 to BLKz. The memory blocks BLK1 to BLKz are coupled to the address decoder 120 through word lines WL. The memory blocks BLK1 to BLKz are coupled to the read/write circuit 130 through bit lines BL1 to BLm. Each of the memory blocks BLK1 to BLKz includes a plurality of memory cells. In an embodiment, the memory cells are nonvolatile memory cells, and in particular, the memory cells may be charge trap device-based nonvolatile memory cells. Memory cells coupled to the same word line, among the plurality of memory cells, are defined as one page. In other words, the memory cell array 110 is formed of a plurality of pages. In addition, each of the memory blocks BLK1 to BLKz of the memory cell array 110 includes a plurality of memory strings. Each of the memory strings includes a drain select transistor, a plurality of memory cells, and a source select transistor which are coupled in series between a bit line and a source line.

The address decoder 120, the read/write circuit 130, and the voltage generator 150 operate as a peripheral circuit 160 for driving the memory cell array 110.

The address decoder 120 is coupled to the memory cell array 110 through the word lines WL. The address decoder 120 is configured operate under control of the control logic 140. The address decoder 120 receives an address ADDR through an input/output buffer (not shown) provided in the semiconductor memory device 100.

During a program voltage applying operation, the address decoder 120 decodes a row address and applies a drain select line voltage VDSL, a source select line voltage VSSL, and a discharge control voltage VWL that are generated from the voltage generator 150, to a drain select line DSL, a source select line SSL, and the plurality of word lines WL of the memory cell array 110 according to the decoded row address.

The address decoder 120 may include a block decoder, a row decoder, a column decoder, an address buffer, etc.

The read/write circuit 130 includes a plurality of page buffers PB1 to PBm. The plurality of page buffers PB1 to PBm are coupled to the memory cell array 110 through the bit lines BL1 to BLm. Before performing an operation of sensing a potential level or current of a bit line for a read operation, a program verification operation, or an erase verification operation, each of the plurality of page buffers PB1 to PBm may apply a positive voltage to a corresponding at least one of the bit lines BL1 to BLm to detrap and discharge charges that have been trapped in channels of the memory strings.

Furthermore, each of the plurality of page buffers PB1 to PBm may temporarily store data DATA inputted during a program operation, control the potential of a corresponding one of the bit lines BL1 to BLm according to the stored data, and sense, during a read operation, the potential or current of the corresponding one of the bit lines BL1 to BLm and perform the read operation. The read/write circuit 130 may be operated under control of the control logic 140.

The control logic 140 is coupled to the address decoder 120, the read/write circuit 130, and the voltage generator 150. The control logic 140 receives a command CMD through an input/output buffer (not shown) of the semiconductor memory device 100. The control logic 140 is configured to control the overall operation of the semiconductor memory device 100 in response to the command CMD.

The control logic 140 may control the address decoder 120, the read/write circuit 130, and the voltage generator 150 such that a channel discharge operation for the memory blocks BLK1 to BLkz is performed before the sensing of the potential level or current of the bit lines is performed for the read operation, the program verification operation, or the erase verification operation. For example, the control logic 140 may control the address decoder 120, the read/write circuit 130, and the voltage generator 150 such that when a command CMD corresponding to a read operation, a program operation, or an erase operation is inputted, the channel discharge operation for the plurality of memory blocks BLK1 to BLKz is performed. In this case, the control logic 140 may control the address decoder 120, the read/write circuit 130, and the voltage generator 150 such that a channel discharge operation for at least one memory block selected among the plurality of memory blocks BLK1 to BLKz is performed, or a channel discharge operation for all of the memory blocks BLK1 to BLKz included in the memory cell array 110 is performed.

The control logic 140 may control the voltage generator 150 and the address decoder 120 such that, during the channel discharge operation, discharge control voltages VWL are successively applied to the memory cells in sequence from memory cells adjacent to a source select transistor SST (see FIG. 3) and the source line to memory cells adjacent to a drain select transistor DST (see FIG. 3) and the bit lines. In another embodiment, the control logic 140 may control the voltage generator 150 and the address decoder 120 such that, during the channel discharge operation, discharge control voltages VWL are successively applied to the memory cells in sequence from the memory cells adjacent to the drain select transistor DST and the bit lines to the memory cells adjacent to the source select transistor SST and the source line.

During the channel discharge operation, under control of the control logic 140, the voltage generator 150 generates, a drain select line voltage VDSL, a source select line voltage VSSL, and a discharge control voltage VWL and outputs these voltages to the address decoder 120. Further, the voltage generator 150 generates a source line voltage VSL and applies it to the source line of the memory cell array 110.

Figure 2:
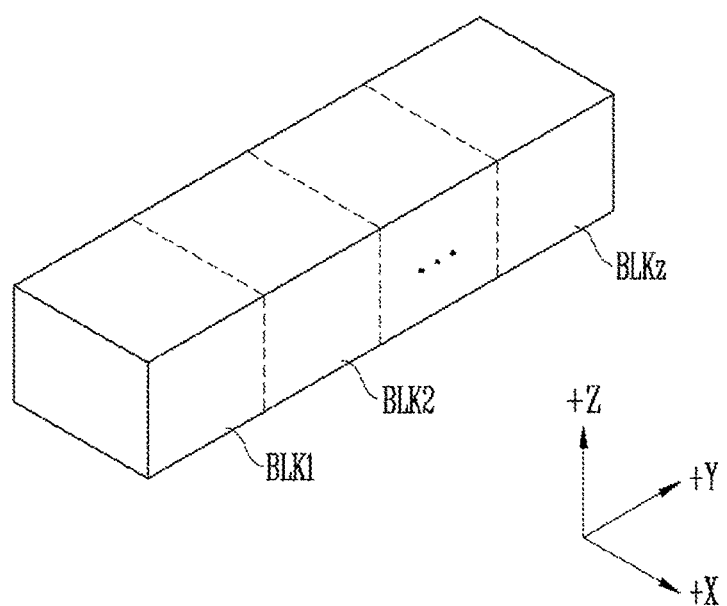
FIG. 2 is a block diagram showing an embodiment of a memory cell array illustrated in FIG. 1.

FIG. 2 is a block diagram showing an embodiment of the memory cell array 110 of FIG. 1.

Referring to FIG. 2, the memory cell array 110 includes the plurality of memory blocks BLK1 to BLKz. Each memory block has a three-dimensional structure. Each memory block includes a plurality of memory cells stacked on a substrate. The memory cells are arranged in +X, +Y, and +Z directions. Various embodiments of the structure of each memory block will be described with reference to FIGS. 3 and 7, which will be explained later herein.

FIG. 3 is a three-dimensional view illustrating a memory string included in the memory block according to the present disclosure. FIG. 4 is a circuit diagram illustrating the memory string.

Referring to FIGS. 3 and 4, a source line SL is formed on a semiconductor substrate. A vertical channel layer SP is formed on the source line SL. An upper portion of the vertical channel layer SP is coupled to a corresponding bit line BL. The vertical channel layer SP may be made of polysilicon. A plurality of conductive layers SSL, WL0 to WLn, and DSL are formed at different heights on the vertical channel layer SP in such a way that each of the conductive layers encloses the vertical channel layer SP. Multi-layers (not shown) including a charge storage layer is formed on a surface of the vertical channel layer SP. The multi-layers are also disposed between the vertical channel layer SP and the conductive layers SSL, WL0 to WLn, and DSL. The multi-layers may be formed in an ONO structure in which an oxide layer, a nitride layer, and an oxide layer are successively stacked.

The lowermost conductive layer forms a source select line SSL. The uppermost conductive layer forms a drain select line DSL. The conductive layers disposed between the select lines SSL and DSL form the respective word lines WL0 to WLn. In other words, the conductive layers SSL, WL0 to WLn, and DSL are formed in a multi-layer structure on the semiconductor substrate. The vertical channel layer SP passing through the conductive layers SSL, WL0 to WLn, and DSL is vertically coupled between the bit line BL and the source line SL formed on the semiconductor substrate.

The drain select transistor DST is formed on a portion of the uppermost conductive layer DSL that encloses the vertical channel layer SP. The source select transistor SST is formed on a portion of the lowermost conductive layer SSL that encloses the vertical channel layer SP. Memory cells MC0 to MCn are respectively formed on portions of the intermediate conductive layers WL0 to WLn that enclose the vertical channel layer SP.

In this way, the memory string includes the source select transistor SST, the memory cells MC0 to MCn, and the drain select transistor DST, which are vertically coupled to the substrate between the source line SL and the bit line BL. The source select transistor SST electrically couples the memory cells MC0 to MCn to the source line SL depending on a source control voltage applied to the source select line SSL. The drain select transistor DST electrically couples the memory cells MC0 to MCn to the bit line BL depending on a drain control voltage applied to the drain select line DSL.

With regard to the above-mentioned vertical channel layer SP of the memory string, electrons generated during overall operations such as the program operation and the read operation may remain in the vertical channel layer SP even after the overall operations, and may be trapped in the channel. The movement of such trapped electrons may depend on a potential level in the vertical channel layer SP. The trapped electrons may reduce the reliability of new overall operations, for example, a read operation, a program verification operation, or an erase verification operation that includes a sensing operation.

FIG. 5 is a flowchart illustrating the operation of a semiconductor memory device according to an embodiment of the present disclosure.

FIG. 6 is a timing diagram showing operating voltages to describe operation of the semiconductor memory device according to an embodiment of the present disclosure.

A method of operating the semiconductor memory device according to an embodiment of the present disclosure will be described with reference to FIGS. 1 to 6.

1) Inputting a Read Command (S110)

The control logic 140 receives a command CMD corresponding to a read command through an input/output buffer (not shown) of the semiconductor memory device 100. Before performing a read operation of the semiconductor memory device 100 in response to receiving the command CMD corresponding to the read command, the control logic 140 generates control signals for controlling the address decoder 120, the read/write circuit 130, and the voltage generator 150 so as to perform a channel discharge operation.

2) Applying a Discharge Control Voltage (S120)

The voltage generator 150 generates, under control of the control logic 140, a source line voltage VSL and applies the source line voltage VSL to the source line SL to which memory strings are coupled in common. The plurality of page buffers PB1 to PBm of the read/write circuit 130 respectively applies positive voltages to the corresponding bit lines BL1 to BLm to which the memory strings are coupled where the positive voltages are applied under control of the control logic 140. Here, the potential levels of the bit lines BL1 to BLm are controlled to be higher than the potential level of the source line SL. The source line voltage VSL may be the ground voltage.

Thereafter, the voltage generator 150 generates a drain select line voltage VDSL and a source select line voltage VSSL. The address decoder 120 applies the drain select line voltage VDSL and the source select line voltage VSSL to the drain select line DSL and the source select line SSL of the memory cell array 110 and turns on the drain select transistor DST and the source select transistor SST.

Subsequently, the control logic 140 may control the peripheral circuit 160 such that discharge control voltages VWL are successively applied to the plurality of word lines WL0 to WLn coupled to the plurality of memory strings in sequence from the word line WL0 adjacent to the source select line SSL to the word line WLn adjacent to the drain select line DSL. That is, the discharge control voltages VWL are successively applied to memory cells in sequence from memory cells MC0 adjacent to the source line SL to memory cells MCn adjacent to the bit lines BL1 to BLm. In this regard, the discharge control voltages VWL may be successively applied to the memory cells with a predetermined time interval D between application of the discharge control voltages VWL to adjacent memory cells. In one example, the peripheral circuit 160 is configured to apply the discharge control voltage VWL to the drain select transistor DST or to the word line WLn adjacent to the drain select line DSL, and then apply the source line voltage VSL to at least one of the plurality of bit lines BL1 to BLm.

When the discharge control voltage VWL is applied to the memory cell MCn, holes that have remained in a channel layer, the vertical channel layer SP for example, corresponding to the memory cell MC0 are transferred toward the source line SL by the ground voltage applied to the source line SL. Further, electrons are transferred in a direction opposite to the source line SL, in other words, toward the bit lines BL1 to BLm. After a predetermined time D has passed, when the discharge control voltage VWL is applied to the memory cell MC1, holes that have remained in a channel layer, the vertical channel layer SP for example, corresponding to the memory cell MC1 are transferred toward the source line SL. Further, electrons that are drawn from the channel layer corresponding to the memory cell MC0 and electrons that have remained in the channel layer corresponding to the memory cell MC1 are transferred in the direction opposite to the source line SL.

In the above-mentioned manner, holes that have remained in the vertical channel layer SP are successively transferred toward the source line SL, and electrons that have remained in the vertical channel layer SP are gradually transferred toward the bit lines BL1 to BLm and thus discharged.

Although, in the present embodiment, positive voltages have been described as being applied to the bit lines BL1 to BLm before the drain select voltage VDSL and the source select voltage VSSL are respectively applied to the drain select line DSL and the source select line SSL, positive voltages may be applied to the bit lines BL1 to BLm after the discharge control voltage VWL is applied to the word line WLn or memory cell MCn adjacent to the drain select line DSL or bit lines BL1 to BLm, so as to maximize the discharge efficiency.

Furthermore, although, in the present embodiment, the plurality of word lines WL0 to WLn have been described as being individually selected and successively applied with discharge control voltages VWL, the word lines WL0 to WLn may be grouped into a plurality of groups in such a way that at least two adjacent word lines are grouped into one group, and discharge control voltages VWL may be successively applied to the groups in sequence from a group adjacent to the source line SL to a group adjacent to the bit lines BL1 to BLm. In one example, the peripheral circuit 160 may divide the plurality of memory cells MC0 to MCn into a plurality of memory groups and successively apply the discharge control voltage VWL to the memory groups in sequence from a memory group adjacent to the source line SL to a memory group adjacent to the bit lines BL1 to BLm.

Although, in the present embodiment, the source line voltage VSL having a potential level of the ground voltage has been described as being continuously applied to the source line SL, a positive voltage may be applied for a predetermined time to the source line SL before the source select line voltage VSSL having a positive potential level is applied to the source select line SSL, and then the potential level may be lowered to the ground voltage. In this way, electrons that have remained in the vertical channel layer of the source select transistor SST may be concentrated toward the source line SL.

3) Performing a Read Operation (S130)

After the channel discharge operation has been completed by the above-mentioned step S120, the control logic 140 controls the peripheral circuit 160 and performs a read operation of the semiconductor memory device.

As described above, according to the present embodiment, when a read command is inputted, electrons and holes that have remained in the channels of the memory string are discharged before a read operation is performed, which improves the reliability of the read operation following the discharging of the electrons and holes.

Figure 7:
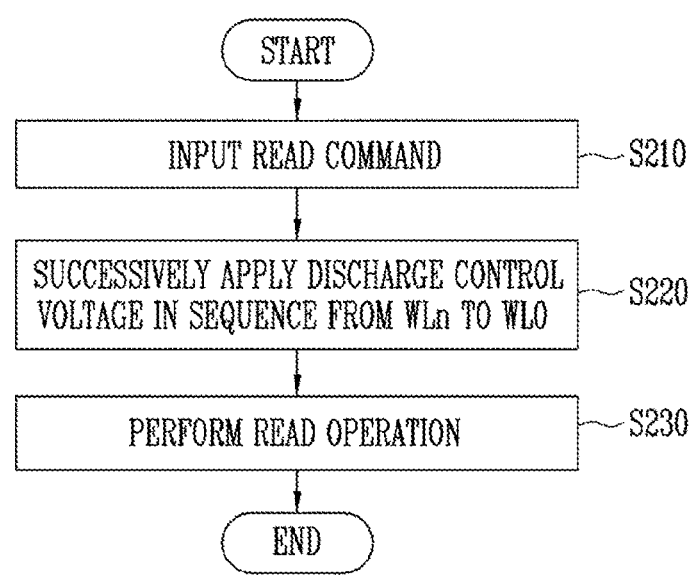
FIG. 7 is a flowchart illustrating operation of a semiconductor memory device according to another embodiment of the present disclosure.

FIG. 7 is a flowchart illustrating the operation of a semiconductor memory device according to another embodiment of the present disclosure.

Figure 8:
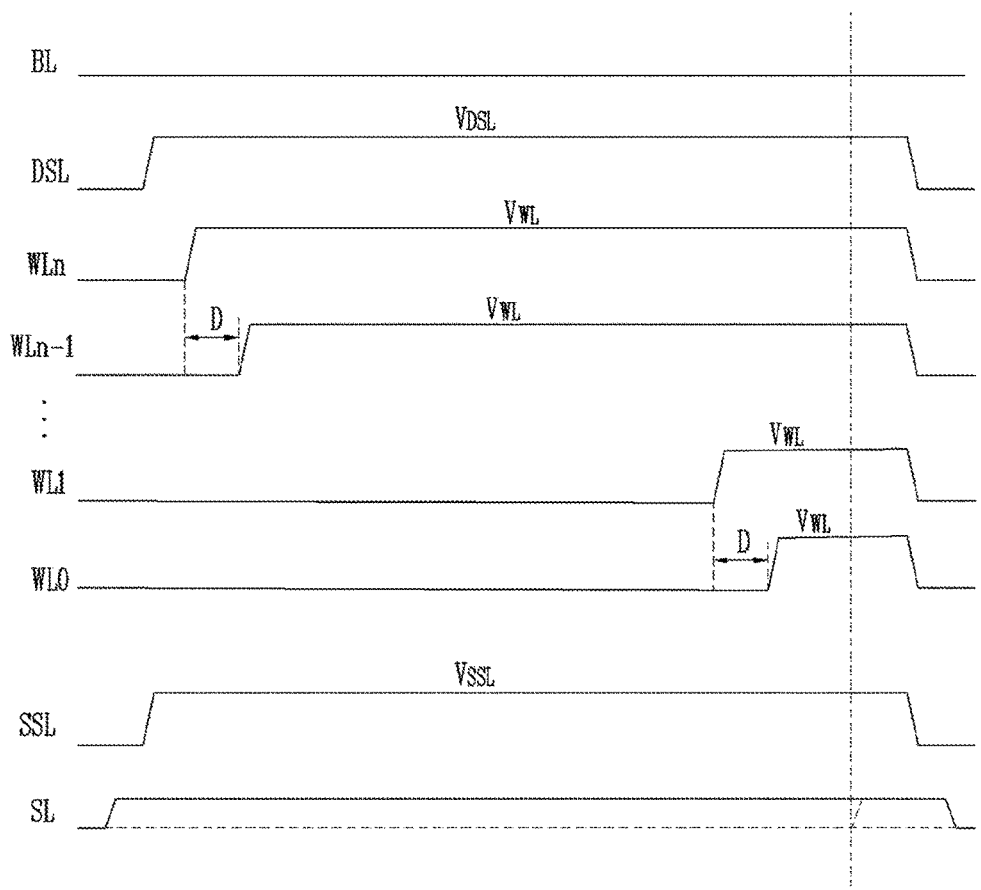
FIG. 8 is a timing diagram showing operating voltages to describe operation of the semiconductor memory device according to another embodiment of the present disclosure.

FIG. 8 is a timing diagram showing operating voltages to describe the operation of the semiconductor memory device according to an embodiment of the present disclosure.

A method of operating the semiconductor memory device according to the present embodiment of the present disclosure will be described with reference to FIGS. 1 to 4, 7 and 8.

1) Inputting a Read Command (S210)

The control logic 140 receives a command CMD corresponding to a read command through an input/output buffer (not shown) of the semiconductor memory device 100. Before performing a read operation of the semiconductor memory device 100 in response to the command CMD corresponding to the read command, the control logic 140 generates control signals for controlling the address decoder 120, the read/write circuit 130, and the voltage generator 150 so as to perform a channel discharge operation.

2) Applying a Discharge Control Voltage (S220)

The plurality of page buffers PB1 to PBm of the read/write circuit 130 respectively applies the ground voltage to the corresponding bit lines BL1 to BLm to which respective memory strings are coupled under control of the control logic 140. The voltage generator 150 generates, under control of the control logic 140, a source line voltage VSL and applies it to the source line SL to which the plurality of memory strings are coupled in common. The source line voltage VSL is higher than voltages applied to the bit lines BL1 to BLm. The source line voltage VSL has a positive potential level.

Thereafter, the voltage generator 150 generates a drain select line voltage VDSL and a source select line voltage VSSL. The address decoder 120 applies the drain select line voltage VDSL and the source select line voltage VSSL to the drain select line DSL and the source select line SSL of the memory cell array 110 and turns on the drain select transistor DST and the source select transistor SST.

Subsequently, the control logic 140 may control the peripheral circuit 160 such that discharge control voltages VWL are successively applied to the plurality of word lines WL0 to WLn coupled to the plurality of memory strings in sequence from the word line WLn adjacent to the drain select line DSL to the word line WL0 adjacent to the source select line SSL. That is, the discharge control voltages VWL are successively applied to memory cells in sequence from memory cells MCn adjacent to the bit lines BL1 to BLm to memory cells MC0 adjacent to the source line SL. In this regard, the discharge control voltages VWL may be successively applied to the memory cells with a predetermined time interval D between application of the discharge control voltages VWL to adjacent memory cells. In one example, the peripheral circuit 160 is configured to apply the discharge control voltage VWL to the word line WL0 adjacent to the source select line SSL, and then apply a positive voltage to the source line SL.

When the discharge control voltage VWL is applied to the memory cell MCn, holes that have remained in a channel layer, the vertical channel layer SP for example, corresponding to the memory cell MCn are transferred toward the bit lines BL1 to BLm by the ground voltage applied to the bit lines BL1 to BLm. Further, electrons are transferred in a direction opposite to the bit lines BL1 to BLm, in other words, toward the source line SL. After a predetermined time D has passed, when the discharge control voltage VWL is applied to the memory cell MCn-1, holes that have remained in a channel layer, the vertical channel layer SP for example, corresponding to the memory cell MCn-1 are transferred toward the bit lines BL1 to BLm. Further, electrons that are drawn from the channel layer corresponding to the memory cell MCn and electrons that has remained in the channel layer corresponding to the memory cell MCn-1 are transferred in the direction opposite to the bit lines BL1 to BLm.

In the above-mentioned manner, holes that have remained in the vertical channel SP are successively transferred toward the bit lines BL1 to BLm, and electrons that have remained in the vertical channel layer SP are gradually transferred toward the source line SL and thus discharged.

Although, in the present embodiment, a positive voltage has been described as being applied to the source line SL before the drain select voltage VDSL and the source select voltage VSSL are respectively applied to the drain select line DSL and the source select line SSL, a positive voltage may be applied to the source line SL after the discharge control voltage VWL is applied to the word line WL0 adjacent to the source select line SSL, as to maximize the discharge efficiency.

Furthermore, although, in the present embodiment, the plurality of word lines WL0 to WLn have been described as being individually selected and successively applied with discharge control voltages VWL, the word lines WL0 to WLn may be grouped into a plurality of groups in such a way that at least two adjacent word lines are grouped into one group, and discharge control voltages VWL may be successively applied to the groups in sequence from a group adjacent to the bit lines BL1 to BLm to a group adjacent to the source line SL. In one example, the peripheral circuit 160 may divide the plurality of memory cells MC0 to MCn into a plurality of memory groups and successively apply the discharge control voltage VWL to the memory groups in sequence from a memory group adjacent to the bit lines BL1 to BLm to a memory group adjacent to the source line SL.

3) Performing a Read Operation (S230)

After the channel discharge operation has been completed by the above-mentioned step S220, the control logic 140 controls the peripheral circuit 160 and performs a read operation of the semiconductor memory device.

As described above, according to the present embodiment, when a read command is inputted, electrons and holes that have remained in the channels of the memory string are discharged before a read operation is performed, which improves the reliability of the read operation following the discharging of the electrons and holes.

Although in the above-mentioned embodiments of the present disclosure, the case where a command for a read operation is inputted has been described as one example, a program verification operation or an erase verification operation, in which a sensing operation is performed, may also be performed in a manner similar to that of the described embodiments. That is, in the case where a command for a program operation or a command for an erase operation is inputted, a channel discharge operation may be performed before the program operation or the erase operation is performed.

Although, in the above-mentioned embodiments of the present disclosure, the channel discharge operation of applying a discharge control voltage has been described as being performed before the overall operations (a read operation, and a program verification and erase verification operation in which the sensing operation is performed) of the semiconductor memory device have been performed, the channel discharge operation may be performed after the overall operations, e.g., a read operation, a program operation, an erase operation, etc., of the semiconductor memory device are performed. In this way, electrons that remain in the channel, depending on voltages applied to the word lines during the overall operations, can be discharged by the channel discharge operation.

Figure 9:
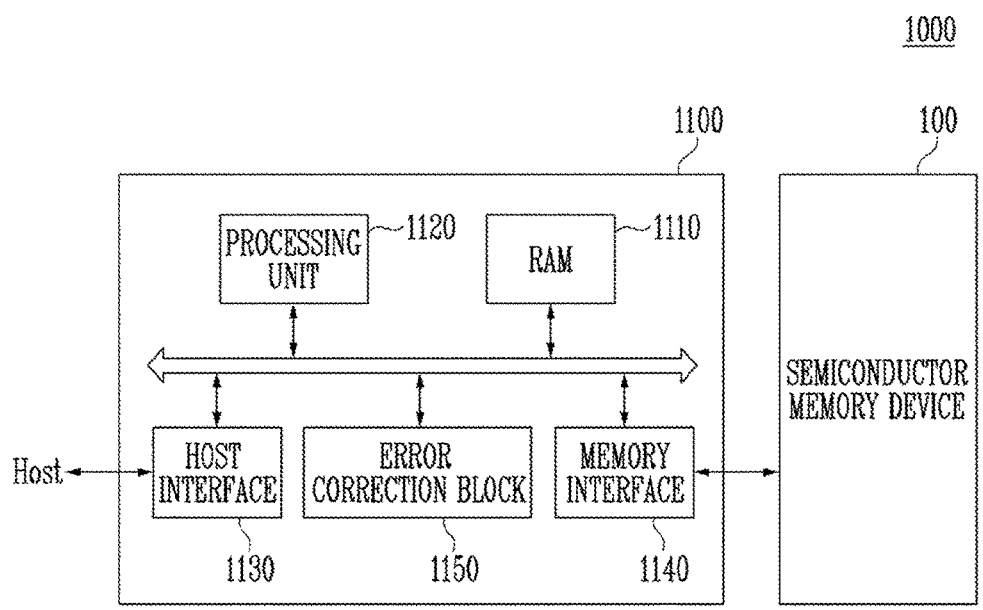
FIG. 9 is a block diagram showing a memory system including the semiconductor memory device of FIG. 1.

Referring to FIG. 9, the memory system 1000 includes the semiconductor memory device 100 and a controller 1100.

The semiconductor memory device 100 may have the same configuration and operation as those of the semiconductor memory device described with reference to FIG. 1. Hereinafter, redundant explanation will be omitted.

The controller 1100 is coupled to a host Host and the semiconductor memory device 100. The controller 1100 is configured to access the semiconductor memory device 100 in response to a request from the host Host. For example, the controller 1100 controls read, write, erase, and background operations of the semiconductor memory device 100. The controller 1100 is configured to provide an interface between the host Host and the semiconductor memory device 100. The controller 1100 is configured to drive firmware for controlling the semiconductor memory device 100.

The controller 1100 includes a RAM (random access memory) 1110, a processor 1120, a host interface 1130, a memory interface 1140, and an error correction block 1150. The RAM 1110 is used as at least one of an operation memory of the processor 1120, a cache memory between the semiconductor memory device 100 and the host Host, and a buffer memory between the semiconductor memory device 100 and the host Host. The processor 1120 controls the overall operations of the controller 1100. In addition, the controller 1100 may temporarily store program data provided from the host Host during the write operation.

The host interface 1130 includes a protocol for performing data exchange between the host Host and the controller 1100. In an example embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 interfaces with the semiconductor memory device 100. For example, the memory interface includes a NAND interface or NOR interface.

The error correction block 1150 uses an error correction code (ECC) to detect and correct an error in data received from the semiconductor memory device 100. The processor 1120 may adjust the read voltage according to an error detection result from the error correction block 1150, and control the semiconductor memory device 100 to perform re-reading. In an example embodiment, the error correction block may be provided as an element of the controller 1100.

The controller 1100 and the semiconductor memory device 100 may be integrated into a single semiconductor device. In an example embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCM-CIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory. When the memory system 1000 is used as the SSD, an operation speed of the host Host coupled to the memory system 2000 may be phenomenally improved.

In another embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various devices for forming a home network, one of various electronic devices for forming a computer network, one of various electronic devices for forming a telematics network, an RFID device, one of various elements for forming a computing system, or the like.

In an example embodiment, the semiconductor memory device 100 or the memory system 1000 may be embedded in various types of packages. For example, the semiconductor memory device 100 or the memory system 1000 may be packaged in a type such as a Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 10:
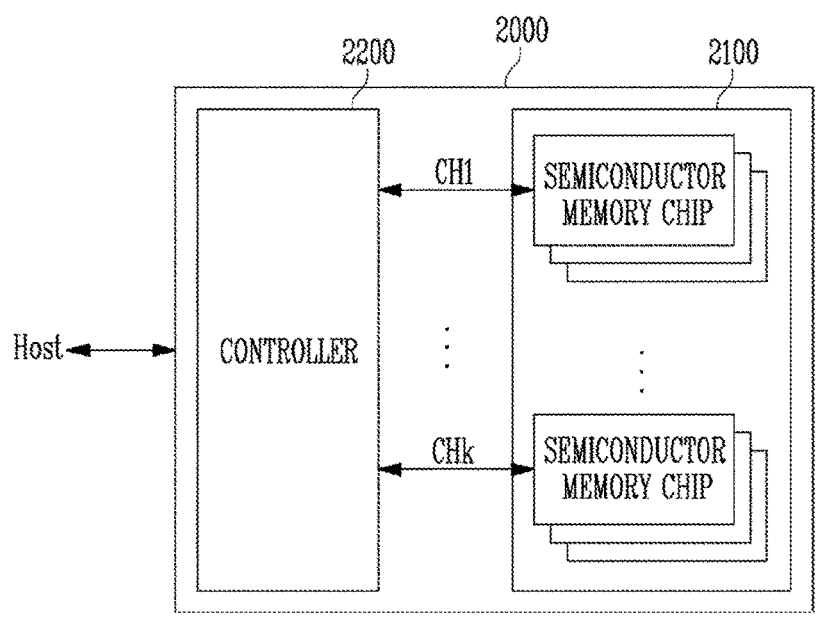
FIG. 10 is a block diagram showing an application example of the memory system of FIG. 9.

FIG. 10 is a block diagram showing an application example of the memory system of FIG. 9.

Referring FIG. 10, the memory system 2000 includes a semiconductor memory device 2100 and a controller 2200. The semiconductor memory device 2100 includes a plurality of memory chips. The semiconductor memory chips are divided into a plurality of groups.

In FIG. 10, it is illustrated that each of the plurality of groups communicates with the controller 2200 through first to k-th channels CH1 to CHk. Each semiconductor memory chip may have the same configuration and operation as those of an embodiment of the semiconductor memory device 100 described with reference to FIG. 1.

Each group communicates with the controller 2200 through one common channel. The controller 2200 has the same configuration as that of the controller 1100 described with reference to FIG. 9 and is configured to control a plurality of memory chips of the semiconductor memory device 2100 through the plurality of channels CH1 to CHk.

Figure 11:
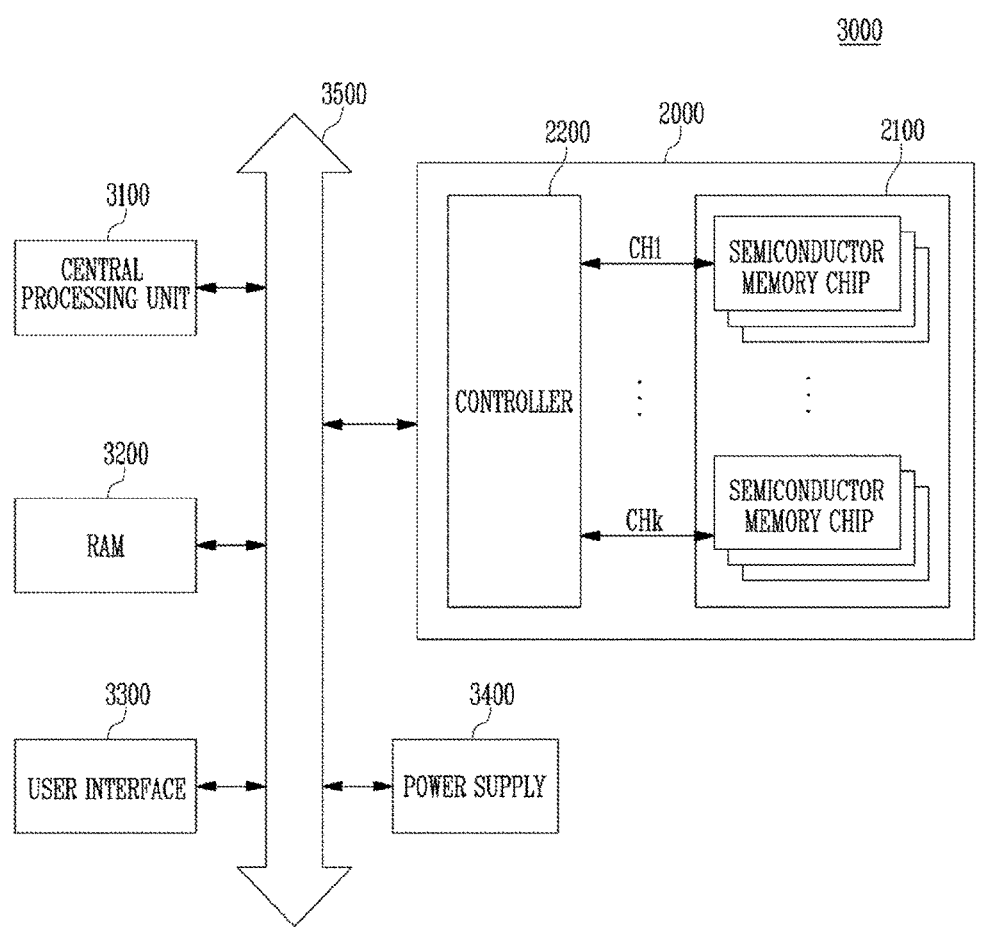
FIG. 11 is a block diagram showing a computing system including a memory system illustrated with reference to FIG. 10.

FIG. 11 is a block diagram showing a computing system including a memory system illustrated with reference to FIG. 10.

Referring to FIG. 11, the computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 11, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 11, the memory system 2000 described with reference to FIG. 10 is illustrated as being provided. However, the memory system 2000 may be replaced with the memory system 1000 described with reference to FIG. 9. In an embodiment, the computing system 3000 may include all the memory systems 1000 and 2000 described with reference to FIGS. 9 and 10.

As described above, according to the present disclosure, charges that have remained in a channel of a memory string are removed before a sensing operation of a semiconductor memory device is performed, whereby the reliability of the sensing operation can be improved.

While the example embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

What is claimed is:

1. A semiconductor memory device comprising:
a drain select transistor coupled to a bit line;
a source select transistor coupled to a source line;
a plurality of memory cells coupled in series between the drain select transistor and the source select transistor; and
a peripheral circuit configured to successively apply a discharge control voltage to the memory cells in sequence from a memory cell adjacent to the source select transistor to a memory cell adjacent to the drain select transistor.

2. The semiconductor memory device according to claim 1,
wherein the peripheral circuit is configured to apply a first voltage to the bit line and apply a second voltage lower than the first voltage to the source line.

3. The semiconductor memory device according to claim 2,
wherein the first voltage is a voltage having a positive potential, and the second voltage is a ground voltage.

4. The semiconductor memory device according to claim 2,
wherein the peripheral circuit is configured to apply, before applying the discharge control voltage to the plurality of memory cells, the first and second voltages to the bit line and the source line and apply a drain select line voltage and a source select line voltage to turn on the drain select transistor and the source select transistor.

5. The semiconductor memory device according to claim 2,
wherein the peripheral circuit is configured to apply the discharge control voltage to, among the plurality of memory cells, the memory cell adjacent to the drain select transistor and then apply the first voltage to the bit line.

6. The semiconductor memory device according to claim 2,
wherein the peripheral circuit is configured to divide the plurality of memory cells into a plurality of memory groups and successively apply the discharge control voltage to the memory groups in sequence from a memory group adjacent to the source line to a memory group adjacent to the bit line.

7. The semiconductor memory device according to claim 1,
wherein the peripheral circuit is configured to apply the discharge control voltage before performing a sensing operation or after performing an overall operation.

8. A semiconductor memory device comprising:
a memory cell array including a plurality of memory strings;
a peripheral circuit configured to apply operating voltages to the memory cell array; and
a control logic configured to control the peripheral circuit such that a discharge control voltage is successively applied to a plurality of word lines coupled to the plurality of memory strings,
wherein the peripheral circuit is configured to successively apply the discharge control voltage to the plurality of word lines in sequence from a word line adjacent to a source select line to a word line adjacent to a drain select line.

9. The semiconductor memory device according to claim 8, wherein the peripheral circuit is configured to apply a first voltage to a plurality of bit lines to which the respective memory strings are coupled, and apply a second voltage to a source line to which the plurality of memory strings are coupled in common.

10. The semiconductor memory device according to claim 9,
wherein the first voltage is a voltage having a positive potential, and the second voltage is a ground voltage.

11. The semiconductor memory device according to claim 10,
wherein the peripheral circuit is configured to apply, before applying the discharge control voltage to the plurality of word lines, the first and second voltages to the plurality of bit lines and the source line and apply a drain select line voltage and a source select line voltage to the drain select line and the source select line.

12. The semiconductor memory device according to claim 10,
wherein the peripheral circuit is configured to apply the discharge control voltage to, among the plurality of word lines, the word line adjacent to the drain select line, and then apply the first voltage to the plurality of bit lines.

13. The semiconductor memory device according to claim 8,
wherein the peripheral circuit is configured to successively apply the discharge control voltage to the plurality of word lines in sequence from a word line adjacent to a drain select line to a word line adjacent to a source select line.

14. The semiconductor memory device according to claim 13,
wherein the peripheral circuit is configured to apply a ground voltage to the plurality of bit lines to which the respective memory strings are coupled, and apply a positive voltage to a source line to which the plurality of memory strings are coupled in common.

15. The semiconductor memory device according to claim 14,
wherein the peripheral circuit is configured to apply, before applying the discharge control voltage to the plurality of word lines, the ground voltage and the positive voltage to the plurality of bit lines and the source line and apply a drain select line voltage and a source select line voltage to the drain select line and the source select line.

16. The semiconductor memory device according to claim 14,
wherein the peripheral circuit is configured to apply the discharge control voltage to, among the plurality of word lines, the word line adjacent to the source select line, and then apply the positive voltage to the source line.

17. The semiconductor memory device according to claim 8,
wherein the peripheral circuit is configured to divide the plurality of word lines into a plurality of groups in such a way that at least two adjacent word lines are grouped into one group, and successively apply the discharge control voltage to the respective groups.

18. A method for operating a semiconductor memory device, comprising:
providing a plurality of memory cells coupled in series between a bit line and a source line;
applying a positive voltage to the bit line and applying a ground voltage to the source line; and
applying the discharge control voltage to the memory cells in sequence from a memory cell adjacent to the source line to a memory cell adjacent to the bit line.

19. The method according to claim 18,
wherein the applying of the positive voltage to the bit line follows the applying of the discharge control voltage to the memory cell adjacent to the bit line.

* * * * *